United States Patent
Ko et al.

(10) Patent No.: US 11,839,157 B2
(45) Date of Patent: Dec. 5, 2023

(54) BIDIRECTIONAL STRETCHABLE AND FLEXIBLE WEARABLE THERMOELECTRIC MODULE

(71) Applicant: Seoul National University R&DB Foundation, Seoul (KR)

(72) Inventors: Seung Hwan Ko, Seoul (KR); Jin Woo Lee, Seoul (KR); Hea Youn Sul, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 17/341,344

(22) Filed: Jun. 7, 2021

(65) Prior Publication Data

US 2021/0296554 A1  Sep. 23, 2021

Related U.S. Application Data

(63) Continuation of application No. PCT/KR2019/015294, filed on Nov. 12, 2019.

(30) Foreign Application Priority Data

Dec. 7, 2018  (KR) .......................... 10-2018-0157129

(51) Int. Cl.
*H10N 10/17* (2023.01)
*H10N 10/01* (2023.01)
(Continued)

(52) U.S. Cl.
CPC ............. *H10N 10/17* (2023.02); *H10N 10/01* (2023.02); *H10N 10/81* (2023.02); *H10N 10/85* (2023.02)

(58) Field of Classification Search
CPC ......... H01L 35/32; H01L 35/04; H01L 35/12; A41D 13/005; A41D 13/008; H10N 10/17; H10N 10/81; H10N 10/85; H10N 10/01
See application file for complete search history.

(56) References Cited

U.S. PATENT DOCUMENTS

2005/0193742 A1* 9/2005 Arnold ................... A42B 3/286
62/3.5
2008/0047598 A1* 2/2008 Lofy ..................... B60N 2/5657
136/203
(Continued)

FOREIGN PATENT DOCUMENTS

JP  2004-140064 A  5/2004
JP  2006-013434 A  1/2006
(Continued)

OTHER PUBLICATIONS

KR20150116187A, Machine Translation (Year: 2015).*
(Continued)

*Primary Examiner* — Devina Pillay
(74) *Attorney, Agent, or Firm* — INSIGHT LAW GROUP, PLLC; Seung Lee

(57) ABSTRACT

Disclosed is a stretchable and flexible thermoelectric module including: a thermoelectric material; a pair of elastic composites having stretchability and flexibility; and a first electrode and a second electrode, which are deformable and electrically connected to both sides of the thermoelectric material, respectively, and whose one surfaces face each other. Thus, since the thermoelectric module has excellent stretchability, flexibility and thermal conductivity, the thermoelectric module is suitably applied to a wearable device that exhibits excellent efficiency during cooling or heating and is in contact with a human body.

13 Claims, 11 Drawing Sheets

(51) Int. Cl.
*H10N 10/81* (2023.01)
*H10N 10/85* (2023.01)

(56) References Cited

U.S. PATENT DOCUMENTS

| | | | |
|---|---|---|---|
| 2014/0231983 A1* | 8/2014 | Sugo | C08L 33/06 |
| | | | 257/734 |
| 2014/0345666 A1* | 11/2014 | Konnai | H01L 35/10 |
| | | | 136/200 |
| 2016/0336503 A1* | 11/2016 | Kasichainula | H01L 35/08 |

FOREIGN PATENT DOCUMENTS

| | | | | |
|---|---|---|---|---|
| JP | 2007-095897 A | | 4/2007 | |
| JP | 2017034135 A | * | 2/2017 | |
| KR | 10-1221581 B1 | | 1/2013 | |
| KR | 10-2015-0116187 A | | 10/2015 | |
| KR | 20150116187 A | * | 10/2015 | H01L 35/02 |
| KR | 10-2017-0049402 A | | 5/2017 | |
| WO | WO-2016067171 A1 | * | 5/2016 | H01L 35/08 |

OTHER PUBLICATIONS

JP2017-034135 A, Machine Translation (Year: 2017).*
International Search Report dated Feb. 26, 2020 for International Application No. PCT/KR2019/015294 and its English translation.

* cited by examiner

FIG. 7A    FIG. 7B
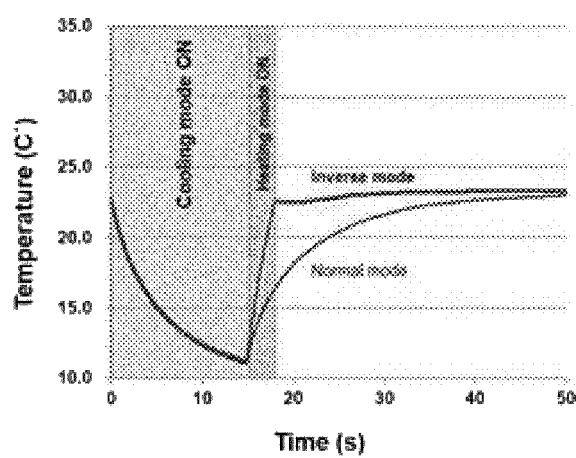
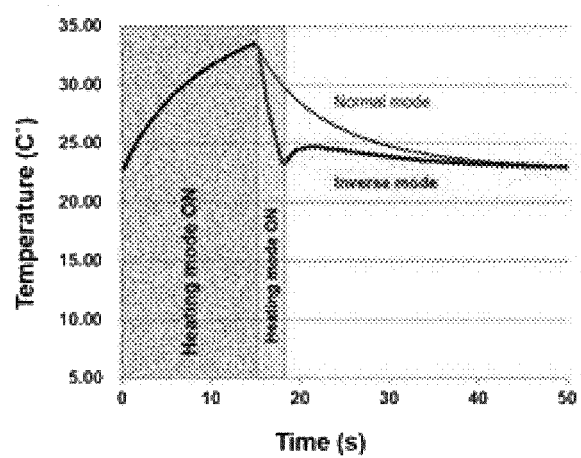

BIDIRECTIONAL STRETCHABLE AND FLEXIBLE WEARABLE THERMOELECTRIC MODULE

CROSS-REFERENCE TO RELATED APPLICATIONS

This application is a continuation application of International Application No. PCT/KR2019/015294, filed on Nov. 12, 2019, which claims the benefit of Korean Patent Application No. 10-2018-0157129, filed on Dec. 7, 2018, in the Korean Intellectual Property Office, the disclosures of which are incorporated herein in their entirety by reference.

TECHNICAL FIELD

The present disclosure relates to a bidirectional stretchable and flexible wearable thermoelectric module.

BACKGROUND ART

Smart clothing refers to clothing that has various digital devices embedded therein, and is configured to sense an external stimulus and react to a preset condition by itself. Examples of such smart clothing include various types of clothing such as a wearable computer, MP3 player-embedded clothing and heating wire-embedded clothing. Among the various types of clothing, heated clothing having a heating wire embedded therein is a representative type of smart clothing. There is a limited market for the heated clothing. The heated clothing has advantages in that it can generate heat by itself, and thus exhibit an excellent heat-retaining function. However, since the heated clothing is configured in such a manner that a thermoelectric module whose stretchability is limited is inserted into a pocket of clothing or attached to clothing, the heated clothing is heavy and inconvenient when a user wears the heated clothing. Therefore, the heated clothing has difficulties in securing sufficient activity and wearing comfort.

In general, the thermoelectric module is manufactured to have a structure in which a second electrode is formed over a ceramic bottom substrate such as alumina, thermoelectric materials made of N-type and P-type semiconductors are formed on the surface of the second electrode, and the N-type thermoelectric material and the P-type thermoelectric material are connected in series through a first electrode. However, such a thermoelectric module has a shape that is difficult to change, and uses a ceramic substrate having no flexible characteristic or a metal substrate coated with a non-conductor thin film. Therefore, the thermoelectric module is difficult to apply to fields that require flexibility.

In order to solve such a problem, a flexible thermoelectric module using a flexible material as a parent material has been suggested. In the case of a rigid thermoelectric module, however, a heat exchanger, a fan and the like, which are fixed structures, are necessarily applied to discharge heat to the outside, and the flexible thermoelectric module cannot be applied to a heating system having such a rigid structure. Therefore, heat generated by the system may be accumulated therein to degrade system performance during a cooling process.

Since the conventional rigid thermoelectric module or flexible thermoelectric module is difficult to contract/stretch according to a motion of a human body, it may not be properly deformed according to the bending information of the human body. Thus, it is difficult to apply the conventional rigid thermoelectric module or flexible thermoelectric module to a wearable device such as smart clothing.

RELATED ART DOCUMENT

Patent Document (Patent Document 1) KR1020170049402 A
(Patent Document 2) KR1020170056853 A

DISCLOSURE

Technical Problem

Various embodiments are directed to a stretchable and flexible thermoelectric module capable of implementing cooling and heating.

Also, various embodiments are directed to a wearable device to which a stretchable and flexible thermoelectric module is applied.

Technical Solution

In an embodiment, a stretchable and flexible thermoelectric module may include: a thermoelectric material; a first electrode and a second electrode, which are deformable and electrically connected to both sides of the thermoelectric material, respectively, and whose one surfaces face each other; a pair of first elastic composites located to abut on at least parts of the one surfaces of the first and second electrodes, respectively; and a pair of second elastic composites located to abut on the other surfaces of the first and second electrodes, respectively.

The first and second elastic composites may each include an elastomer and a metal nano material.

The first and second elastic composites may each include the metal nano material in an amount of 20 to 60 wt % based on 100 wt % of the total content of the corresponding elastic composite.

The first and second elastic composites may be copper electrodes.

The first and second electrodes may each include: a pair of thermoelectric material contact portions formed in a circular shape; and a connection portion formed to have a curvature on a plane, and configured to connect the pair of thermoelectric material contact portions to each other.

The first and second electrodes may each include: a pair of thermoelectric material contact portions formed in a circular shape; and a connection portion formed to have a curvature on a plane, and configured to connect the pair of thermoelectric material contact portions to each other. The thermoelectric material may be located to abut on the thermoelectric material contact portions and electrically connected to the first or second electrode.

The first and second electrodes may each include: a pair of thermoelectric material contact portions formed in a circular shape; and a connection portion formed to have a curvature on a plane, and configured to connect the pair of thermoelectric material contact portions to each other, wherein the first elastic composite is located to abut on at least a part of one surface of the connection portion.

The connection portion may have a width of 500 to 700 μm.

At least parts of the first and second elastic composites located with the first or second electrode interposed therebetween may be directly in contact with each other.

In another embodiment, a stretchable and flexible thermoelectric module may include: a thermoelectric material; at least a pair of elastic composites having flexibility and elasticity; and a first electrode and a second electrode, which are deformable, and at least partially inserted into the elastic composites, and whose at least parts are electrically connected to both sides of the thermoelectric material, respectively.

In still another embodiment, a method for manufacturing a stretchable and flexible thermoelectric module may include: a first step of preparing an electrode material; a second step of forming an electrode by placing the electrode material on one surface of a thermally conductive elastic composite, and processing the electrode material using laser; a third step of applying the thermally conductive elastic composite onto the structure manufactured in the second step and heating the thermally conductive elastic composite; a fourth step of manufacturing a first structure in which a part of the electrode is exposed, by exposing the electrode by removing at least a part of the elastic composite applied in the third step; a fifth step of preparing a second structure by repeating the first to fourth steps; and a sixth step of connecting the first and second structures with a thermoelectric material interposed therebetween.

The first step may be performed by coating the electrode material with a polyimide solution.

The elastic composite may be manufactured by mixing an elastomer and a metal nano material.

The heating of the third step may be performed at a temperature of 50 to 70 µm for 5 to 20 minutes.

The electrode may include: a pair of thermoelectric material contact portions formed in a circular shape; and a connection portion formed to have a curvature on a plane, and configured to connect the pair of thermoelectric material contact portions to each other. In the fourth step, at least a part of the thermoelectric material contact portion may be exposed.

The sixth step may include connecting the thermoelectric material and the electrode through soldering, heating and pressing.

Advantageous Effects

In accordance with an embodiment of the present disclosure, it is possible to provide a thermoelectric module that has excellent stretchability, flexibility and thermal conductivity, and thus has excellent efficiency during cooling or heating.

Furthermore, it is possible to provide a thermoelectric module that is suitably applied to a wearable device such as smart clothing, because the thermoelectric module can be flexibly bent and stretched according to a motion of a human body when attached to the human body.

Furthermore, it is possible to provide a thermoelectric module which can perform both cooling and heating by changing the direction of a current, and easily change the temperature by switching to a cooling mode or heating mode, if necessary. By changing the direction of the current after cooling or heating is finished, the thermoelectric module can adjust the temperature within a shorter time than in natural convection. Thus, when the thermoelectric module is applied to a device that is in contact with a human body so as to perform warning or cooling, the device can quickly provide heat sensation desired by a user.

Furthermore, since an electrode having a specific structure is applied, heat generated in the thermoelectric module is not accumulated therein, even though the thermoelectric module does not include a fan structure such as a conventional rigid thermoelectric module, which makes it possible to reduce degradation in device performance by cooling.

BRIEF DESCRIPTION OF DRAWINGS

FIGS. 7A and 7B are graphs showing results obtained by measuring and comparing the times required until the temperatures reach room temperature through an inverse mode and a normal mode during a cooling/heating process in accordance with an embodiment of the present disclosure.

MODE FOR INVENTION

Hereafter, specific embodiments of the present disclosure will be described with reference to the accompanying drawings. However, the embodiments are only exemplary embodiments, and the present disclosure is not limited thereto.

In the following descriptions for the present disclosure, detailed descriptions for publicly known functions or configurations related to the present disclosure will be ruled out in order not to unnecessarily obscure subject matters of the present disclosure. Furthermore, the terms described below are terms defined by considering the functions thereof in the present disclosure, and may be changed according to the intention of a user or an operator or the practice. Therefore, the terms should be defined based on the entire contents of this specification.

The technical idea of the present disclosure is determined by the claims, and the following embodiments are only means for efficiently describe the progressive technical idea of the present disclosure to those skilled in the art to which the present disclosure pertains.

Furthermore, since the accompanying drawings are only examples for describing the technical idea of the present disclosure in more detail, the technical idea of the present disclosure is not limited to the shapes of the accompanying drawings.

Figure 1:
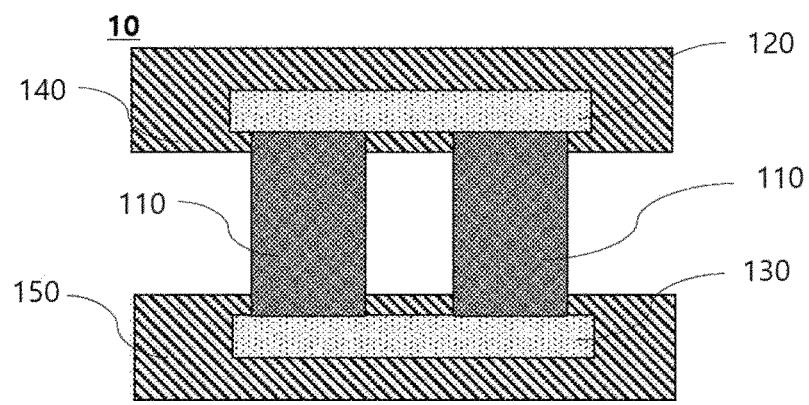
FIG. 1 is a cross-sectional view illustrating a thermoelectric module in accordance with an embodiment of the present disclosure.

Throughout the specification, when one element is referred to as being 'connected to' or 'coupled to' another element, it may indicate that the former element is 'directly connected or coupled to' the latter element or 'indirectly connected or coupled to' the latter element with still another element or controller interposed therebetween. Furthermore, it may indicate that the former element is mechanically or electrically connected or coupled to the latter element. Furthermore, when an element 'includes' a component, it may indicate that the element does not exclude another component unless referred to the contrary, but can further include another component. In accordance with an aspect of the present disclosure, a thermoelectric module may be provided. FIG. 1 illustrates a thermoelectric module in accordance with an embodiment of the present disclosure. A thermoelectric module 10 in accordance with the embodiment of the present disclosure may include: a thermoelectric material 110; a pair of electrodes 120 and 130 connected to both sides of the thermoelectric material 110, respectively; and a plurality of elastic composites 140 and 150 located to abut on at least parts of the pair of electrodes 120 and 130, respectively.

The thermoelectric material 110 may include a p-type or n-type semiconductor. Specifically, the thermoelectric material 110 may be a p-type thermoelectric material including a p-type semiconductor or an n-type thermoelectric material including an n-type semiconductor. The p-type thermoelectric material and the n-type thermoelectric material may be electrically connected through the electrodes 120 and 130 which will be described below. The thermoelectric material 110 may include one or more compounds selected from the group consisting of silicon (Si), aluminum (Al), calcium (Ca), natrium (Na), germanium (Ge), iron (Fe), lead (Pb), antimony (Sb), tellurium (Te), bismuth (Bi), cobalt (Co), cerium (Ce), tin (Sn), nickel (Ni), copper (Cu), potassium (K), platinum (Pt), ruthenium (Ru), rhodium (Rh), gold (Au), tungsten (W), palladium (Pd), titanium (Ti), tantalum (Ta), molybdenum (Mo), hafnium (Hf), lanthanum (La), iridium (Ir), silver (Ag), boron (B), gallium (Ga), selenium (Se) and indium (In). However, the thermoelectric material 110 is not limited thereto. Specifically, the thermoelectric material 110 may include one or more compounds selected from the group consisting of Se, Ni, Al, Cu, Ag, Pb, B, Ga, Te, Bi and In, when the thermoelectric material 110 is an n-type thermoelectric material, and include one or more compounds selected from the group consisting of Sb, Ni, Al, Cu, Ag, Pb, B, Ga, Te, Bi and In, when the thermoelectric material 110 is a p-type thermoelectric material. The thermoelectric material 110 may have a pin or pillar shape. The pillar shape may be a cylindrical or polygonal pillar shape. In the present embodiment, the case in which the thermoelectric material 110 has a rectangular pillar shape will be taken as an example for description. The diameter of the thermoelectric material 110 is not limited, but set to micrometers.

The pair of electrodes 120 and 130 may include a deformable inorganic material which has excellent electrical conductivity. At this time, 'deformable' indicates that the electrodes can be flexibly bent. The inorganic material may include one or more selected from the group consisting of Ni, Al, Cu, Ru, Rh, Au, W, Co, Pd, Ti, Ta, Fe, Mo, Hf, La, Ir and Ag, but is not limited thereto. In the present embodiment, the case in which the pair of electrodes 120 and 130 are copper electrodes will be taken as an example for description.

The pair of electrodes 120 and 130 may be connected to one side and the other side of the above-described thermoelectric material 110, respectively. At this time, the meaning of 'connection' is not limited as long as the pair of electrodes 120 and 130 are electrically connected to the above-described thermoelectric material 110. For example, the pair of electrodes 120 and 130 and the thermoelectric material 110 may be connected through a conductive adhesive or solder. In the following descriptions for the present embodiment, the electrode connected to the one side of the thermoelectric material 110, between the pair of electrodes 120 and 130, will be referred to as a first electrode 120, and the electrode connected to the other side of the thermoelectric material 110 will be referred to as a second electrode 130. The n-type thermoelectric material and the p-type thermoelectric material may be connected through the first electrode 120 and the second electrode 130. Specifically, the n-type and p-type thermoelectric materials may be connected so that one sides thereof abut on the first electrode 120 and the other sides thereof abut on the second electrode 130. Thus, the n-type and p-type thermoelectric materials may be electrically connected to each other. Through such a connection, the first and second electrodes 120 and 130 may be disposed so that one surfaces thereof face each other. In the following descriptions for the present embodiment, the one surfaces of the first and second electrodes 120 and 130 which are disposed to face each other will be referred to as opposed surfaces, respectively. The thermoelectric material 110 may abut on the opposed surfaces of the first and second electrodes 120 and 130.

Figure 2:
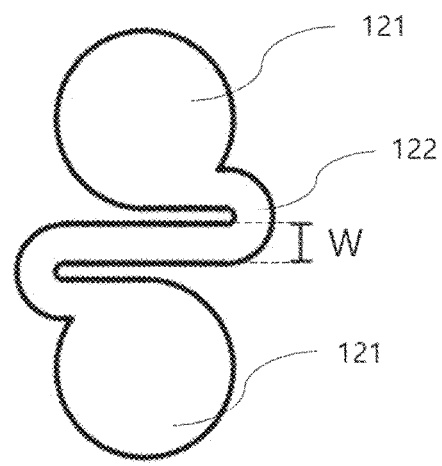
FIG. 2 is a plan view illustrating an electrode in accordance with an embodiment of the present disclosure.

The thermoelectric module in accordance with the embodiment of the present disclosure can implement tension suitable for a wearable device, because the electrodes used for connecting the thermoelectric material 110 are configured to have a specific structure which will be described below. The first and second electrodes 120 and 130 may have shapes corresponding to each other. FIG. 2 illustrates the shapes of the first and second electrodes 120 and 130. Referring to FIG. 2, the first and second electrodes 120 and 130 may each include a pair of thermoelectric material contact portions 121 and a connection portion 122.

Through the thermoelectric material contact portion 121 for connection with the thermoelectric material 110, at least parts of the electrodes 120 and 130 in accordance with the present embodiment may be electrically connected to both sides of the thermoelectric material 110, respectively. The thermoelectric material 110 may be located to abut on the thermoelectric material contact portions 121, and electrically connected to the first or second electrode 120 or 130. At this time, the thermoelectric material contact portions 121 may be in contact with different thermoelectric materials 110, respectively. Specifically, one of the pair of thermoelectric material contact portions 121 may be in contact with a first thermoelectric material, and the other of the pair of thermoelectric material contact portions 121 may be in contact with a second thermoelectric material. At this time, the first thermoelectric material may be an n-type thermoelectric material, and the second thermoelectric material may be a p-type thermoelectric material.

The thermoelectric material contact portion 121 is not limited to a specific shape, and may include a planar surface. In order to reduce mechanical resistance which is applied to the thermoelectric module in accordance with the embodiment of the present disclosure when the thermoelectric module is bent in various directions, the thermoelectric module may be manufactured to have a curved planar surface which includes no angular portions or corners. In the present embodiment, the case in which the thermoelectric module has a circular planar surface will be taken as an example for description. The thermoelectric material contact portion 121 may be formed to have an area equal to or larger than the surface through which the thermoelectric material 110 is in contact with the corresponding electrode. In the present embodiment, the case in which the thermoelectric material 110 is formed in a rectangular pillar shape and has one rectangular surface abutting on the thermoelectric material contact portion 121, and the thermoelectric material contact portion 121 is formed in a circular shape with an area in which the rectangular surface can be included will be taken as an example for description.

The pair of thermoelectric material contact portions 121 may be connected to each other through the connection portion 122. The connection portion 120 may be formed to have a curvature. At this time, the connection portion 120 may be formed to have a curvature on one plane where the pair of thermoelectric material contact portions 121 and the connection portion 122 are placed. Specifically, when the directions are described based on the assumption that a horizontal direction in FIG. 2 is set to an X-axis, a vertical direction in FIG. 2 is set to a Y-axis, and a direction crossing the horizontal and vertical directions at a right angle in a 3D manner is set to a Z-axis, the connection portion 122 may be formed to have a curvature on a plane constituted by the X-axis and the Y-axis. More specifically, the connection portion 122 may be formed to have a curvature on the X- or Y-axis, not the Z-axis. Alternatively, the connection portion 122 may be formed to have a curvature on the X-axis and the Y-axis, not the Z-axis. In the present embodiment, the case in which the connection portion 122 is formed in an S-shape to have a curvature in the Y-axis direction will be taken as an example for description. In the present embodiment, as described above, the thermoelectric material contact portions 121 may be flexibly connected through the connection portion 122 having a curvature. Through such a structure, the thermoelectric material 110 in contact with the thermoelectric material contact portion 121 may be flexibly and stretchably moved in a 3D manner. For example, when a tensile force is applied in the Y-axis direction, the electrodes 120 and 130 may be elastically stretched while the curvature of the connection portion 122 is reduced.

Figure 3:
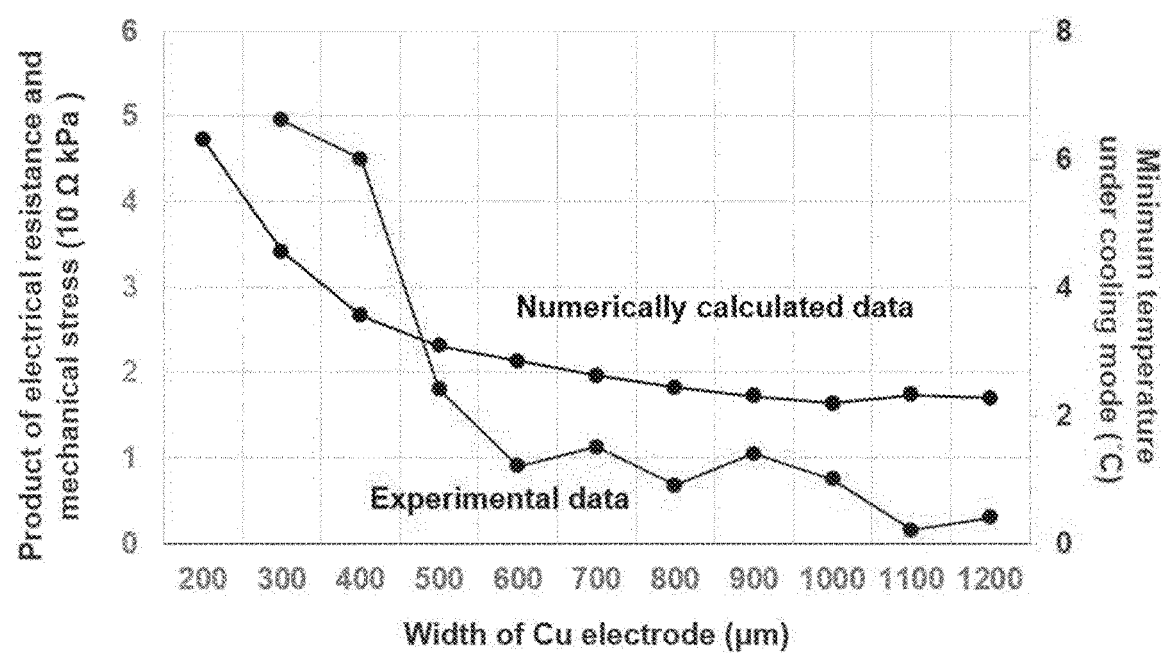
FIG. 3 is a graph showing a result obtained by performing optimization according to the line width of the electrode in accordance with the embodiment of the present disclosure.

Since the thermoelectric module operates according to an electric distribution of electrons and holes, electric resistance acts as a very important factor for the thermoelectric module. When the thermoelectric module is manufactured to include a copper electrode, the thermoelectric module may be easily stretched. In this case, the smaller the line width of the electrode, the stronger characteristic for mechanical stress the thermoelectric module has. Thus, when the electrode is designed, the line width of the electrode may be set to a variable while the thickness thereof is fixed, and the product of electrical resistance and mechanical stress applied to the electrode in the case that the thermoelectric module is stretched by 50% may be calculated through a simulation to perform optimization. The result is illustrated in FIG. 3. At this time, the line width indicates the line width W of the connection portion 122 illustrated in FIG. 2. FIG. 3 shows that the slope of the product of electrical resistance and mechanical stress becomes gentle in such a range that the line width of the electrode is equal to or more than 600 µm. As described above, when the electrode has an excessively large line width, the mechanical strength of the electrode may be reduced. Thus, the line width of the connection portion 122 for the optimization of the electrode performance may be set in a range of 500 to 700 µm, which can retain electric conductivity and exhibit excellent stretchability while considering the wearable performance and mechanical strength of the thermoelectric module, based on a line width of 600 µm.

The first and second electrodes 120 and 130 may be disposed to abut on the pair of elastic composites 140 and 150, respectively. At this time, the electrodes 120 and 130 may be disposed so as to be at least partially inserted into the respective elastic composites 140 and 150. Through such a structure, the elastic composites may be disposed to abut on the one surfaces and the other surfaces of the first and second electrodes 120 and 130, the one surfaces corresponding to the opposed surfaces of the first and second electrodes 120 and 130.

Figure 4:
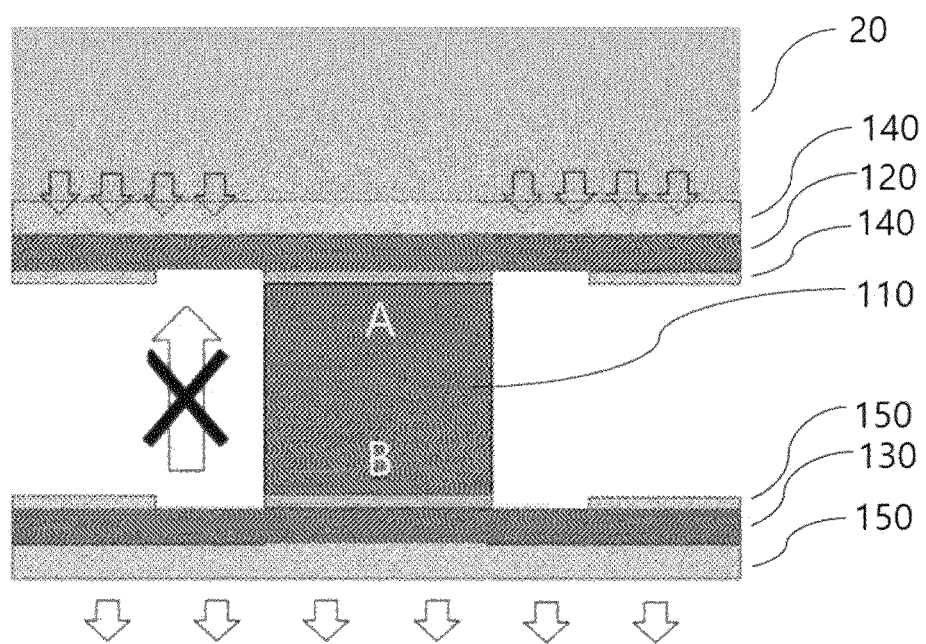
FIG. 4 is a diagram illustrating the direction of thermal conduction during a cooling mode in accordance with the embodiment of the present disclosure.

The elastic composites 140 and 150 may have flexibility and elasticity, and each include an elastomer and a metal nano material. The material of elastomer is not specially limited as long as the material has elasticity and flexibility. For example, silicon polymer-based materials may be applied as the material of elastomer. The size of metal nano material is not specially limited as long as the inorganic materials have nano sizes. For example, the metal nano material may be nano silver particles. The elastic composites 140 and 150 which are composite materials each including an elastomer and a metal nano material may not have electric conductivity, but significantly improve the thermophysical property. Specifically, the elastic composites 140 and 150 may be manufactured by mixing an elastomer whose shape can be freely changed with a metal nano-material having excellent conductivity, and thinly applied onto the copper electrodes 120 and 130 to improve the thermal conductivity of the thermoelectric module in accordance with the present embodiment. The elastic composites 140 and 150 may be applied to the surface through which heat transfer is to be promoted, and heat generated on a system may be accumulated therein to prevent degradation in performance of the thermoelectric module during a cooling process. Furthermore, since the elastic composites 140 and 150 serve to improve thermal conductivity, the amount of heat exchanged through the thermoelectric module in accordance with the embodiment of the present disclosure, to which the elastic composites 140 and 150 are applied, during a cooling or heating process may be increased to improve the efficiency of the thermoelectric module. FIG. 4 illustrates the direction of thermal conductivity and the improvement in heat radiation performance by the elastic composites 140 and 150 which are applied when the thermoelectric module in accordance with the present embodiment is attached to a human body in order to cool the human body. In FIG. 4, arrows indicates the direction of thermal conduction, and thermal conduction in such a direction that the thermoelectric module does not abut on a human body 20 indicates heat radiation. One side A of the thermoelectric material 110 serves as a cooling part, and the other side B of the thermoelectric material 110 serves as a heating part. Referring to FIG. 4, an air layer may be present between the electrodes 120 and 130 which are disposed to face each other with the thermoelectric material 110 interposed therebetween and between the elastic composites 140 and 150 which are disposed to face each other with the thermoelectric material 110 interposed therebetween, and thermal conduction from the side on which the thermoelectric module does not abut on the human body may be blocked.

Figure 5:
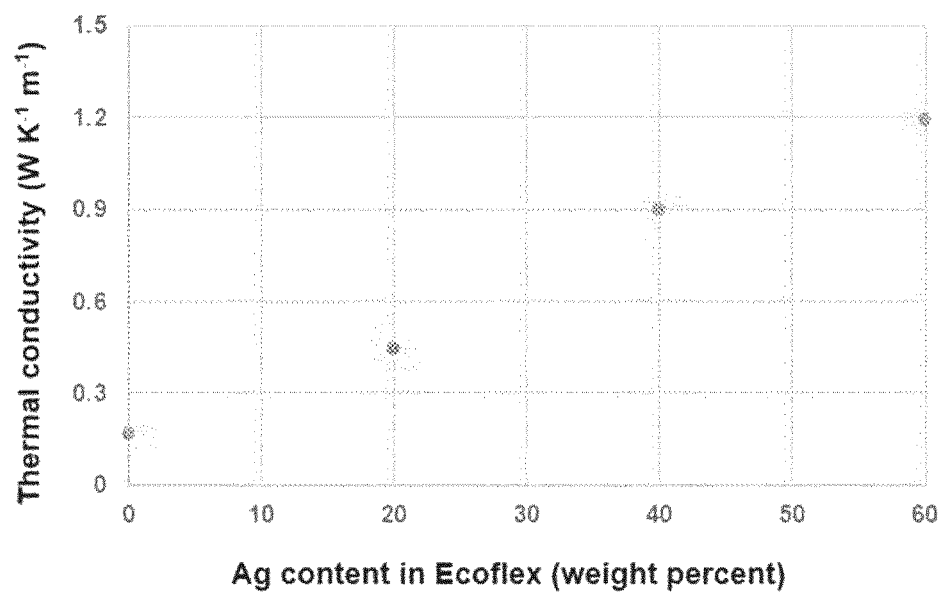
FIG. 5 is a graph showing the effect of thermal conductivity according to the mixing ratio of an elastomer and a metal nano material in an elastic composite in accordance with the embodiment of the present disclosure.

FIG. 5 shows results obtained by checking the effects of thermal conductivity in the elastic composites 140 and 150, according to the weight percent ratio of the elastomer and the metal nano material.

When the content of the metal nano material included in the elastic composites 140 and 150 exceeds 60 wt % based on 100 wt % of the total content of the elastic composites 140 and 150, the dispersibility of the metal nano material may be degraded to cause a problem such as particle aggregation. FIG. 5 comparatively shows the case in which the content of the metal nano material included in the elastic composite 140 or 150 is 0 wt % and the case in which the content of the metal nano material included in the elastic composite 140 or 150 is 60 wt %, based on 100 wt % of the total content of the elastic composite 140 or 150. Referring to FIG. 5, the thermal conductivity of the elastic composites 140 and 150 including the metal nano material in an amount of 60 wt % is six times higher than that of the elastic composite 140 or 150 including the metal nono material in an amount of 0 wt %. Thus, the weight percent ratio of the elastomer and the metal nano material may be set so that the elastic composite 140 or 150 includes the metal nano material in an amount of 20 to 60 wt %, based on 100 wt % of the total content of the elastic composite 140 or 150. In the present embodiment, the case in which elastic composite 140 or 150 including the metal nano material in an amount of 60 wt % is used will be taken as an example for description.

Figure 6:
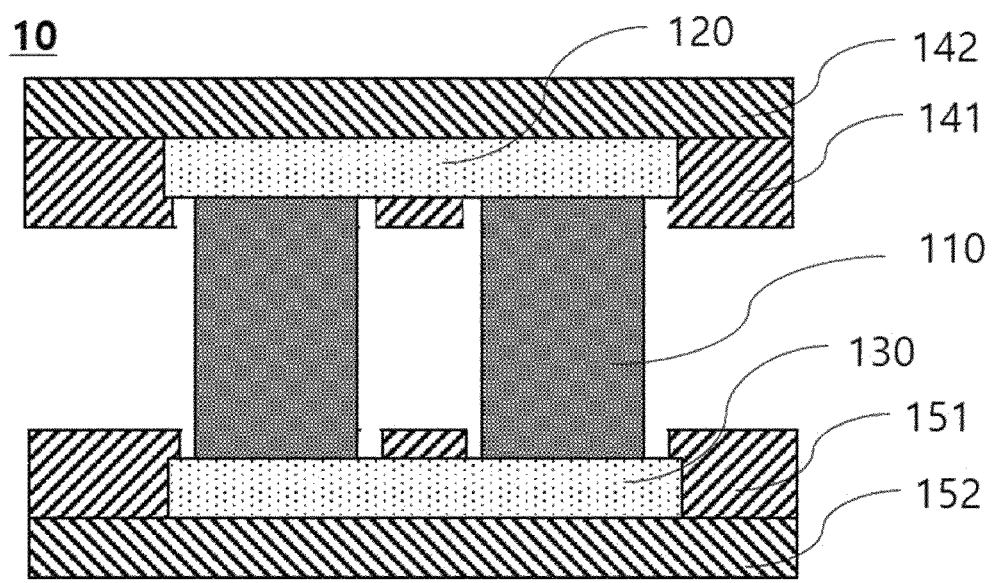
FIG. 6 is a cross-sectional view illustrating a thermoelectric module in accordance with another embodiment of the present disclosure.

FIG. 6 is a cross-sectional view illustrating a thermoelectric module in accordance with another embodiment of the present disclosure. Referring FIG. 4, the pair of elastic composites may include first elastic composites 141 and 151 and second elastic composites 142 and 152, respectively. According to a manufacturing method in accordance with an embodiment of the present disclosure, which will be described below, the elastic composites may be manufactured in two steps, respectively, which are distinguished from each other. In the descriptions for the present embodiment, the case in which the elastic composites include the pair of first elastic composites 141 and 151 and the pair of second elastic composites 142 and 152, which are distinguished from each other, will be taken as an example for description. Such a configuration is only an example for convenience of description, and does not make a significant difference between the first elastic composites 141 and 151 and the second elastic composites 142 and 152.

The pair of first elastic composites 141 and 151 may be located to abut on at least parts of the opposed surfaces of the first and second electrodes 120 and 130, respectively. The pair of second elastic composites 142 and 152 may be located to abut on at least parts of the other surfaces of the first and second electrodes 120 and 130, respectively. At this time, the first elastic composites 141 and 151 may be located to abut on at least parts of the opposed surfaces of the electrodes 120 and 130. Specifically, the first elastic composites 141 and 151 may be located to abut on at least parts of the opposed surfaces (one surfaces) of the connection portions 122 included in the electrodes 120 and 130. Furthermore, the second elastic composites 142 and 152 may be located to abut on the entire other surfaces of the electrodes 120 and 130. Such a structure in which at least parts of the connection portions 122 abut on all of the first elastic composites 141 and 151 and the second elastic composites 142 and 152 may prevent a degradation in mechanical property and improve the durability. The first elastic composites 141 and 151 or the second elastic composites 142 and 152 may be located with the first or second electrode 120 or 130 interposed therebetween, and parts of the first elastic composites 141 and 151 or the second elastic composites 142 and 152, which face each other while not abutting on the electrode 120 or 130, may be directly in contact with each other. In such a structure, the electrodes 120 and 130 in accordance with the present embodiment may be at least partially inserted into the elastic composites while abutting on all of the first elastic composites 141 and 151 and the second elastic composites 142 and 152.

The thermoelectric module in accordance with the embodiment of the present disclosure may perform both cooling and heating according to the direction of a current. When the direction of the current is changed after the cooling or heating is ended, the temperature of the thermoelectric module may reach room temperature within a shorter time than in a case to rely on natural convection. In the descriptions of the present embodiment, such a function performed by changing the direction of the current is referred to as an inverse mode, and a mode to rely on the natural conversion is referred to a normal mode. FIGS. 7A and 7B show results obtained by measuring and comparing the times required until the temperatures, which are changed after cooling and heating are each performed in the inverse mode and the normal mode, reach room temperature again. FIG. 7A shows the result obtained by comparing the times required until the temperatures reach room temperature after cooling is performed, and FIG. 7B shows the result obtained by comparing the times required until the temperatures reach room temperature after heating is performed. Referring to FIGS. 7A and 7B, the time required until the temperature reaches room temperature through the inverse mode is seven to eight times shorter than in the normal mode, during both cooling and heating.

Figure 9:
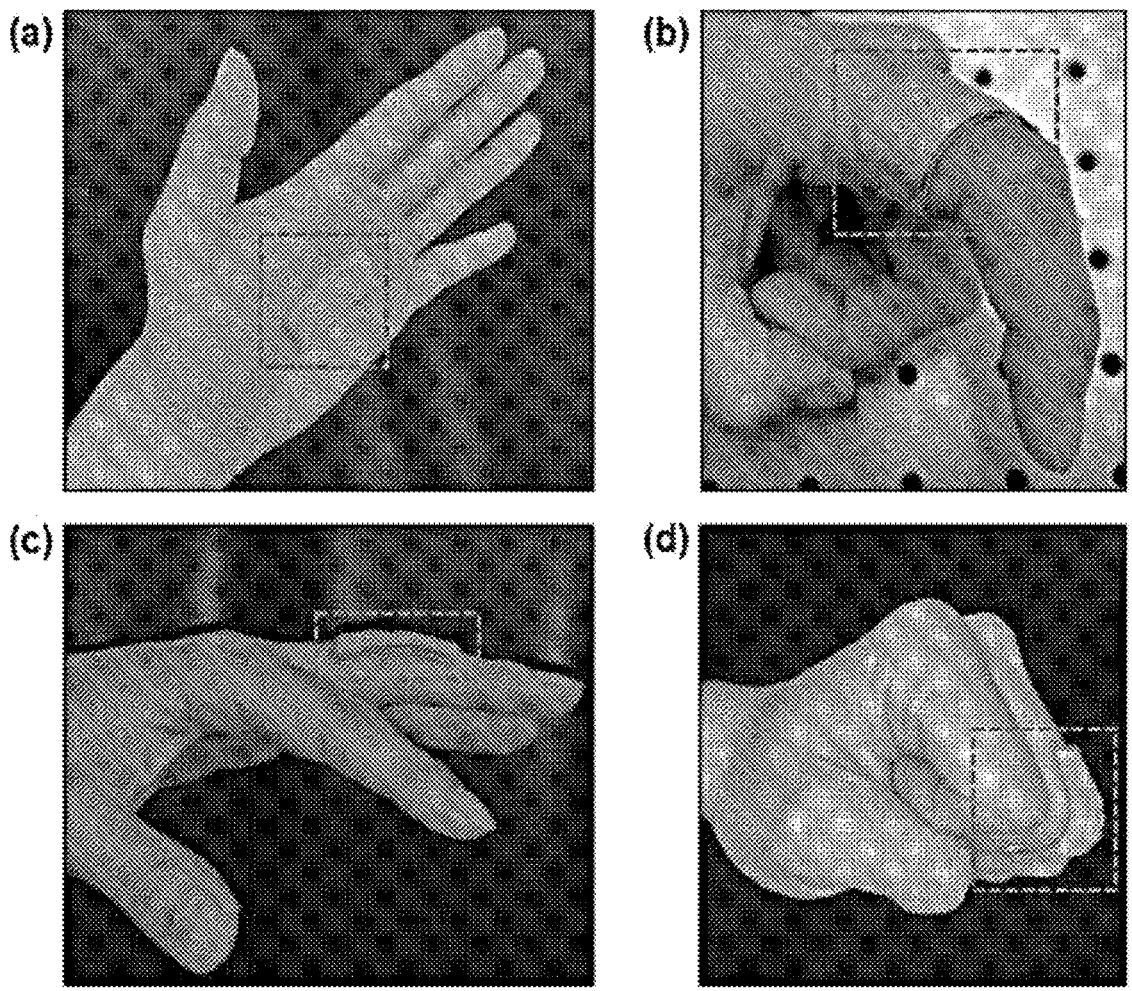
FIG. 9 is a photograph showing an elasticity of a thermoelectric module in accordance with the embodiment of the present disclosure.

In accordance with another embodiment of the present disclosure, a wearable device including the above-described thermoelectric module may be provided. The wearable device in accordance with the present disclosure may comprise the thermoelectric module in accordance with the present disclosure, and a wearing part to which the thermoelectric module is attached, and which is formed to contact a body of the wearer. The wearing part of the wearing device can have a various form of clothes which the wearer can put on, and may be preferably a glove that can be worn by a hand of the wearer. The glove may comprise at least one finger reception portion which receives a finger of the wearer, and the thermoelectric module may be attached to one end of the finger receiving portion. Meanwhile, the thermoelectric module in accordance with the present disclosure may also be attached to a curved surface, and may be contracted or expanded according to movement of the skin of the body. Thus, the thermoelectric module can be attached to the portion where a palm of the wearer contacts. This is applicable to any portion of the wearing part for which the wearer can experience virtual thermal sensation. FIG. 9 illustrates that the thermoelectric module in accordance with the present disclosure can be attached to a body and is capable of contracting and expanding.

Figure 10:
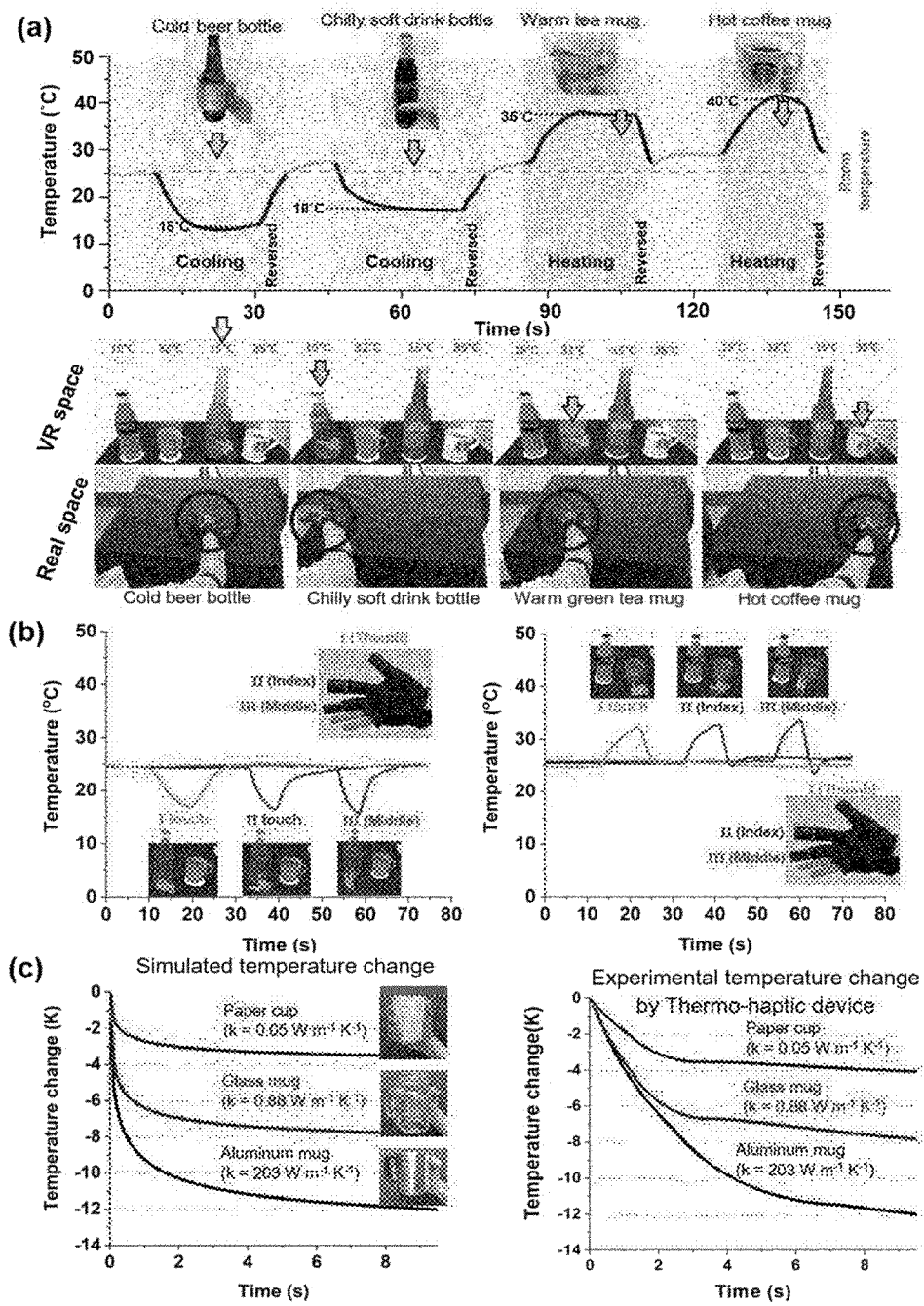
FIG. 10 is a diagram illustrating an experimental example of the wearable device which includes a thermoelectric module in accordance with the embodiment of the present disclosure.

Meanwhile, the thermoelectric module in accordance with an embodiment of the present disclosure may provide a thermal sensational environment similar to the reality when it is in contact with an object with a certain temperature in the virtual reality. More specifically, in case of contacting an object with a certain temperature in a virtual reality, the thermal transfer coefficient of the object is applied according to a corresponding algorithm so that, in contacting different objects in the virtual reality, the degree of cooling and heating of the thermoelectric model can be adjusted. A heat exchange can be accomplished through the inverse mode and normal mode as described above, when the thermoelectric module in accordance with the embodiment of the present disclosure performs the cooling and heating. FIG. 10 illustrates an experimental example illustrating the temperature changes when a wearable device including the thermoelectric module in accordance with the embodiment of the present disclosure is worn and is in contact with an object in a virtual reality.

Figure 8:
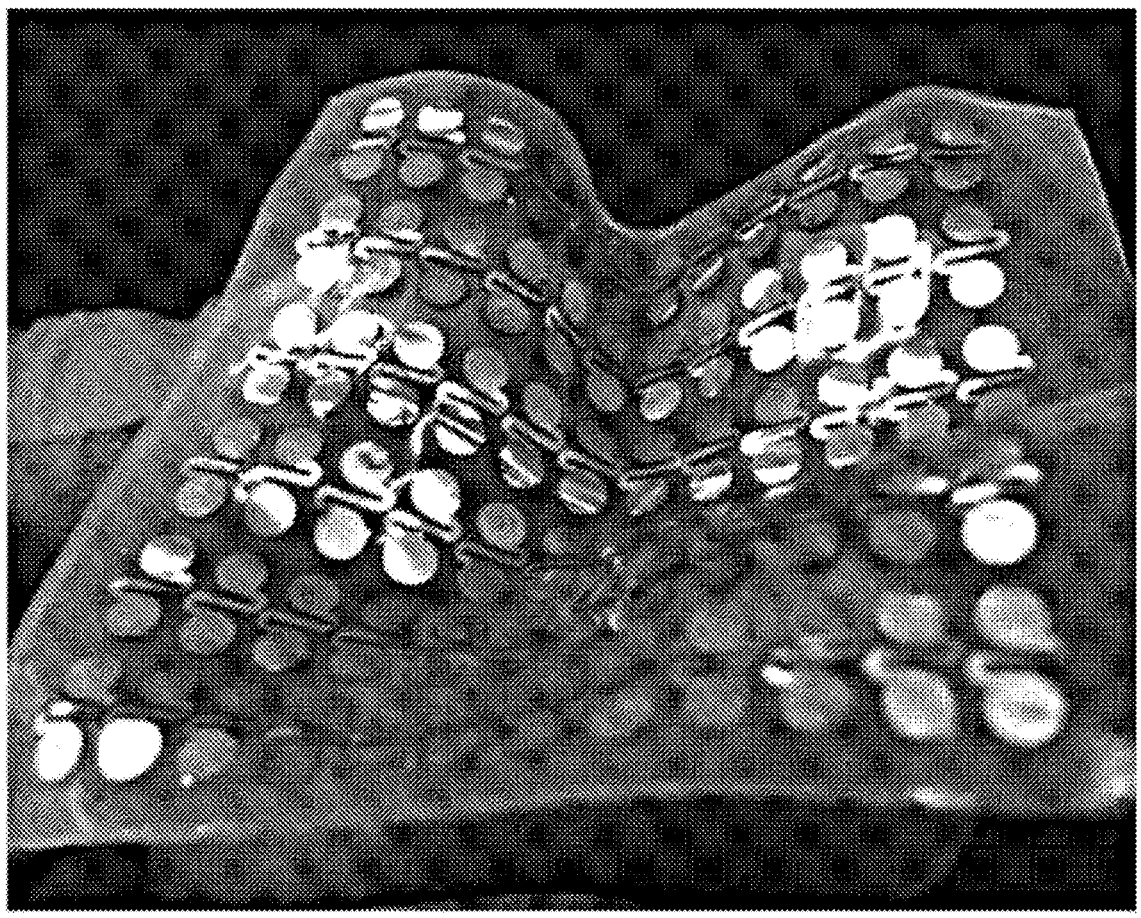
FIG. 8 is a photograph of the thermoelectric module in accordance with the embodiment of the present disclosure.

FIG. 8 shows a photograph of the thermoelectric module in accordance with the embodiment of the present disclosure in which the plurality of electrodes 120 and 130 designed to easily stretch are disposed and to which the elastic composites 140 and 150 are applied. The thermoelectric module in accordance with the embodiment of the present disclosure may improve the performance thereof during the cooling process, while exhibiting stretchability through the thermally conductive elastic composites 140 and 150. Furthermore, when the thermoelectric module is in contact with a human body, the thermoelectric module may improve the efficiency of heat exchange with the human body. Since the thermoelectric module in accordance with the embodiment of the present disclosure does not require an enormous device, the thermoelectric module may be configured as a compact system, and suitably applied to a wearable electronic device which requires flexibility and elasticity according to various shapes, and is difficult to apply to a large-sized system. Furthermore, since the thermoelectric module can be attached to even a bent structure, the thermoelectric module may be applied as a thermoelectric module system which can be attached to various shapes. Since a wearable electronic device to which the thermoelectric module in accordance with the embodiment of the present disclosure is applied can perform both cooling and heating, the temperature thereof may quickly return to room temperature after cooling or heating is performed. The wearable electronic device can quickly provide heat sensation desired by a wearer.

Figure 11:
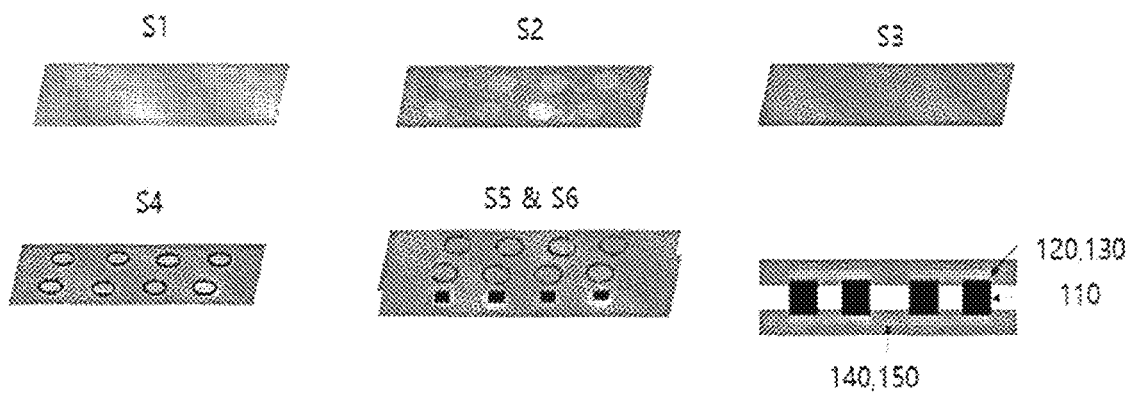
FIG. 11 is a diagram illustrating steps of a method for manufacturing a thermoelectric module in accordance with an embodiment of the present disclosure.

In accordance with another aspect of the present disclosure, a method for manufacturing a thermoelectric module may be provided. The method for manufacturing a thermoelectric module in accordance with an embodiment of the present disclosure may include: a first step S1 of preparing an electrode material; a second step S2 of forming an electrode by placing the electrode material on one surface of a thermally conductive elastic composite and processing the electrode material using laser; a third step S3 of applying the thermally conductive elastic composite onto the structure manufactured in the second step S2 and heating the thermally conductive elastic composite; a fourth step S4 of manufacturing a first structure in which a part of the electrode is exposed, by exposing the electrode by removing at least a part of the thermally conductive elastic composite applied in the third step S3; a fifth step S5 of preparing a second structure by repeating the first to fourth steps; and a sixth step S6 of connecting the first structure and the second structure with a thermoelectric material interposed therebetween. FIG. 11 illustrates the steps of the method for manufacturing a thermoelectric module in accordance with the embodiment of the present disclosure.

The first step S1 may be performed by coating the electrode material with a flexible polymer solution. The polymer may be polyimide, for example. However, the polymer is not limited thereto. The coating may be performed by coating an electrode material foil with the polymer solution and heating the coated electrode material foil. For example, when a copper foil is applied as the electrode material and a polyimide solution is used as the polymer solution, the first step may be performed by coating the copper foil with the polyimide solution, heating the coated copper foil at a temperature of 120 to 150° C. (desirably, 140° C.) for 3 to 5 minutes (desirably, 4 minutes) under the atmospheric condition, and then heating the coated copper foil at a temperature of 230 to 270° C. (desirably, 250° C.) for 40 to 80 minutes (desirably, one hour) under a nitrogen environment.

In the second step S2, the electrode may be formed to have the above-described specific structure. Particularly, the electrode may include a pair of thermoelectric material contact portions and a connection portion. At this time, the connection portion serves to connect the pair of thermoelectric material contact portions, and may be formed to have a curvature on a plane. The electrode may be formed by placing the electrode material prepared in the previous step S1 on the thermally conductive elastic composite, and processing the resultant structure. The processing method is not specifically limited, but may include laser processing. The thermally conductive elastic composite may be manufactured by mixing an elastomer and a metal nano material.

Then, the step S3 may be performed to apply the thermally conductive elastic composite to one side of the structure formed in the previous step S2, through which the electrode is exposed. After the applying process of the third step S3, heating is performed. At this time, the heating may be performed at a temperature of 50 to 70° C. (desirably, 60° C.) for 5 to 20 minutes (desirably, 10 minutes).

Then, at least a part of the thermoelectric material contact portion may be exposed in the fourth step S4. The fourth step S4 may be performed by exposing the electrode by forming a hole in the elastomer using laser. At this time, at least a part of the exposed electrode may include at least a part of the above-described thermoelectric material contact portion.

Then, the fifth step S5 may be performed to repeat the first to fourth steps once more. In the fifth step S5, the same structure as the structure manufactured through the previous steps may be prepared to form a pair. Then, in the sixth step S6, the thermoelectric materials and the electrodes may be connected through soldering, heating and pressing, in order to manufacture the thermoelectric module in accordance with the embodiment of the present disclosure.

While various embodiments have been described above, it will be understood to those skilled in the art that the embodiments described are by way of example only. Accordingly, the disclosure described herein should not be limited based on the described embodiments.

The invention claimed is:
1. A stretchable and flexible thermoelectric module comprising:
   a thermoelectric material;
   at least a pair of elastic composites having flexibility and elasticity; and
   a first electrode and a second electrode, which are deformable, and at least partially inserted into the elastic composites, and whose at least parts are electrically connected to two sides of the thermoelectric material, respectively,
   wherein the first and second elastic composites each include a metal nano material in an amount of 20 to 60 wt % based on 100 wt % of the total content of the corresponding elastic composite, and
   cooling and heating are performed by changing the direction of the current by performing an inverse mode,
   wherein the first and second electrodes each comprises:

a pair of thermoelectric material contact portions formed as a circular plate, wherein at least one of the pair of thermoelectric material contact portions formed as a circular plate has a lower surface with an area larger than a contacting area which is in contact with the thermoelectric material; and a connection portion formed to have a curvature on a plane, and configured to connect the pair of thermoelectric material contact portions to each other, wherein the connection portion has a width of 500 to 700 µm, and wherein at least part of the thermoelectric material is embedded into the pair of elastic composites.

2. A stretchable and flexible thermoelectric module comprising:

a thermoelectric material;

a first electrode and a second electrode, which are deformable and electrically connected to two sides of the thermoelectric material, respectively, wherein a lower surface of the first electrode faces an upper surface of the second electrode;

a pair of first elastic composites located to abut on at least a part of the first electrode; and a pair of second elastic composites located to abut on at least a part of the second electrode, wherein the first and second elastic composites each include a metal nano material in an amount of 20 to 60 wt % based on 100 wt % of the total content of the corresponding elastic composite, and wherein cooling and heating are performed by changing the direction of the current by performing an inverse mode, wherein the first and second electrodes each comprises:

a pair of thermoelectric material contact portions formed as a circular plate, wherein at least one of the pair of thermoelectric material contact portions formed as a circular plate has a lower surface with an area larger than a contacting area which is in contact with the thermoelectric material;

a connection portion formed to have a curvature on a plane, and configured to connect the pair of thermoelectric material contact portions to each other, and wherein the connection portion has a width of 500 to 700 µm; and wherein the first electrode is embedded in the pair of first elastic composites and the second electrode is embedded in the pair of second elastic composites, and at least a part of the thermoelectric material is embedded in the pair of first elastic composites and at least another part of the thermoelectric material is embedded in the pair of second elastic composites.

3. The stretchable and flexible thermoelectric module of claim 2, wherein each of the first and second electrodes comprises copper.

4. The stretchable and flexible thermoelectric module of claim 2, wherein the first elastic composite is located to abut on at least a part of the surface of the connection portion.

5. The stretchable and flexible thermoelectric module of claim 2, wherein at least parts of the first and second elastic composites located with the first or second electrode interposed therebetween are directly in contact with each other.

6. The stretchable and flexible thermoelectric module of claim 2, wherein the thermoelectric material is located to abut on one of the pair of thermoelectric material contact portions and electrically connected to at least one of the first and second electrodes.

7. The stretchable and flexible thermoelectric module of claim 6, wherein the connection portion is embedded in a corresponding elastic composite.

8. A wearable device, comprising:

the thermoelectric module according to claim 2; and a wearing part formed to be in contact with a body, and to which the thermoelectric module is attached.

9. The wearable device of claim 8, wherein the wearing part comprises at least one finger receiving portion that receives a finger of a wearer.

10. The wearable device of claim 9, wherein the thermoelectric module is attached to one end of the at least one finger receiving portion.

11. The stretchable and flexible thermoelectric module of claim 2, wherein the pair of first elastic composites comprises a first elastic composite and a second elastic composite, a lower surface of the first elastic composite abuts an upper surface of the first electrode, the second elastic composite surrounds side surfaces of the first electrode and partly covers the lower surface of the first electrode, and wherein the pair of second elastic composites comprise a third elastic composite and a fourth elastic composite, an upper surface of the fourth elastic composite abuts a lower surface of the second electrode, the third elastic composite surrounds side surfaces of the second electrode and partly covers the upper surface of the second electrode.

12. The stretchable and flexible thermoelectric module of claim 11, wherein the second elastic composite comprises a first through hole to pass the thermoelectric material, and the third elastic composite comprises a second through hole to pass the thermoelectric material, and the thermoelectric material penetrates the first through hole to contact the lower surface of the first electrode and the second through hole to contact the upper surface of the second electrode.

13. The stretchable and flexible thermoelectric module of claim 12, wherein a part of the lower surface of the first electrode is exposed to air and a part of the upper surface of the second electrode is exposed to air.

* * * * *